(12) United States Patent
Farshchian et al.

(10) Patent No.: US 11,109,517 B2
(45) Date of Patent: Aug. 31, 2021

(54) COOLING ELECTRONIC DEVICES IN A DATA CENTER

(71) Applicant: Google LLC, Mountain View, CA (US)

(72) Inventors: Soheil Farshchian, San Jose, CA (US); Madhu Krishnan Iyengar, Foster City, CA (US)

(73) Assignee: Google LLC, Mountain View, CA (US)

( * ) Notice: Subject to any disclaimer, the term of this patent is extended or adjusted under 35 U.S.C. 154(b) by 84 days.

(21) Appl. No.: 16/555,562

(22) Filed: Aug. 29, 2019

(65) Prior Publication Data
US 2020/0015387 A1    Jan. 9, 2020

Related U.S. Application Data

(63) Continuation of application No. 14/703,566, filed on May 4, 2015, now Pat. No. 10,448,543.

(51) Int. Cl.
*H05K 7/20* (2006.01)
*G06F 1/20* (2006.01)

(52) U.S. Cl.
CPC .......... *H05K 7/20818* (2013.01); *G06F 1/20* (2013.01); *H05K 7/2029* (2013.01); *H05K 7/20336* (2013.01); *H05K 7/20663* (2013.01); *H05K 7/20672* (2013.01); *H05K 7/20809* (2013.01);
(Continued)

(58) Field of Classification Search
CPC ............... H05K 7/208; H05K 7/20809; H05K 7/20818; H05K 7/20663; H05K 7/20672; H05K 7/20681; H05K 7/20545; H05K 7/20336; H05K 7/2029; G06F 1/20; G06F 2200/201
See application file for complete search history.

(56) References Cited

U.S. PATENT DOCUMENTS

| | | |
|---|---|---|
| 4,290,440 A | 9/1981 | Sturgis |
| 4,777,561 A | 10/1988 | Murphy et al. |
| 4,884,168 A | 11/1989 | August et al. |
| | (Continued) | |

FOREIGN PATENT DOCUMENTS

| | | |
|---|---|---|
| CN | 101437385 | 5/2009 |
| CN | 102576240 | 7/2012 |
| | (Continued) | |

OTHER PUBLICATIONS

CN Office Action in Chinese Application No. 201911018863.0, dated Nov. 24, 2020, 15 pages (with English translation).
(Continued)

*Primary Examiner* — Jianying C Atkisson
*Assistant Examiner* — Miguel A Diaz
(74) *Attorney, Agent, or Firm* — Fish & Richardson P.C.

(57) ABSTRACT

A server rack thermosiphon system includes a plurality of evaporators, each evaporator including a thermal interface for one or more heat-generating server rack devices; at least one condenser mounted to an external structure of a server rack, the condenser including a fluid-cooled heat transfer module; a liquid conduit that fluidly couples each of the evaporators to the condenser to deliver a liquid phase of a working fluid from the condenser to the evaporators; and a vapor conduit that fluidly couples each of the evaporators to the condenser to deliver a mixed phase of the working fluid from the evaporators to the condenser.

20 Claims, 5 Drawing Sheets

(52) U.S. Cl.
CPC .... *G06F 2200/201* (2013.01); *H05K 7/20545* (2013.01); *H05K 7/20681* (2013.01)

(56) References Cited

U.S. PATENT DOCUMENTS

| | | | |
|---|---|---|---|
| 5,768,104 | A | 6/1998 | Salmonson et al. |
| 5,907,475 | A | 5/1999 | Babinski et al. |
| 5,946,191 | A * | 8/1999 | Oyamada ............ H05K 7/20672 165/104.14 |
| 5,953,930 | A | 9/1999 | Chu et al. |
| 5,998,863 | A | 12/1999 | Kobayashi et al. |
| 6,055,157 | A | 4/2000 | Bartilson |
| 6,151,215 | A | 11/2000 | Hoffman |
| 6,205,803 | B1 | 3/2001 | Scaringe |
| 6,325,092 | B1 | 12/2001 | Pirkle |
| 6,477,847 | B1 | 11/2002 | Bonaquist et al. |
| 6,549,408 | B2 | 4/2003 | Berchowitz |
| 6,550,255 | B2 | 4/2003 | Rudick et al. |
| 6,657,121 | B2 | 12/2003 | Garner |
| 6,761,212 | B2 | 7/2004 | DiPaolo |
| 6,775,137 | B2 | 8/2004 | Chu et al. |
| 6,804,117 | B2 | 10/2004 | Phillips et al. |
| 6,828,675 | B2 * | 12/2004 | Memory ............ H05K 7/20681 165/104.33 |
| 6,910,637 | B2 | 6/2005 | Hsieh et al. |
| 6,924,981 | B2 | 8/2005 | Chu et al. |
| 6,972,365 | B2 | 12/2005 | Garner |
| 7,025,129 | B2 | 4/2006 | Chiu |
| 7,071,408 | B2 | 7/2006 | Garner |
| 7,130,191 | B2 | 10/2006 | Lin et al. |
| 7,212,409 | B1 * | 5/2007 | Belady ..................... G06F 1/20 361/721 |
| 7,231,961 | B2 | 6/2007 | Belits et al. |
| 7,286,351 | B2 | 10/2007 | Campbell et al. |
| 7,309,911 | B2 | 12/2007 | Bartley et al. |
| 7,318,322 | B2 | 1/2008 | Ota et al. |
| 7,397,662 | B2 | 7/2008 | Oyamada |
| 7,403,384 | B2 | 7/2008 | Pflueger |
| 7,457,118 | B1 * | 11/2008 | French ............... H05K 7/20936 361/679.48 |
| 7,511,960 | B2 | 3/2009 | Hillis et al. |
| 7,564,685 | B2 | 7/2009 | Clidaras et al. |
| 7,599,184 | B2 | 10/2009 | Upadhya et al. |
| 7,639,499 | B1 * | 12/2009 | Campbell .......... H05K 7/20772 165/104.19 |
| 7,701,714 | B2 | 4/2010 | Shabany |
| 7,719,837 | B2 | 5/2010 | Wu et al. |
| 7,835,151 | B2 * | 11/2010 | Olesen .................. H01L 23/473 361/689 |
| 7,958,935 | B2 | 6/2011 | Belits et al. |
| 7,961,475 | B2 * | 6/2011 | Campbell .......... H05K 7/20772 361/748 |
| 8,031,464 | B2 | 10/2011 | Adkins et al. |
| 8,077,463 | B2 | 12/2011 | Lee |
| 8,130,497 | B2 | 3/2012 | Kondo et al. |
| 8,164,902 | B2 | 4/2012 | Matsushima et al. |
| 8,184,436 | B2 * | 5/2012 | Campbell .......... H05K 7/20809 361/700 |
| 8,351,206 | B2 * | 1/2013 | Campbell .......... H05K 7/20809 361/700 |
| 8,422,218 | B2 | 4/2013 | Fried et al. |
| 8,644,020 | B2 | 2/2014 | Lau et al. |
| 8,731,733 | B2 | 5/2014 | Patel et al. |
| 8,773,854 | B2 | 7/2014 | Rice et al. |
| 9,596,787 | B1 | 3/2017 | Iyengar |
| 9,693,485 | B2 | 6/2017 | Inaba |
| 9,839,164 | B2 | 12/2017 | Shelnutt |
| 10,058,009 | B2 * | 8/2018 | Huang ............... H05K 7/20172 |
| 10,136,556 | B2 | 11/2018 | Bilski |
| 2002/0014324 | A1 | 2/2002 | DiPaolo |
| 2002/0053726 | A1 | 5/2002 | Mikubo et al. |
| 2003/0000721 | A1 * | 1/2003 | Garner ............... H05K 7/20809 174/50 |
| 2003/0128508 | A1 | 7/2003 | Faneuf et al. |
| 2003/0128516 | A1 | 7/2003 | Faneuf et al. |
| 2004/0037045 | A1 | 2/2004 | Phillips |
| 2004/0057211 | A1 * | 3/2004 | Kondo ...................... G06F 1/20 361/696 |
| 2004/0225816 | A1 | 11/2004 | Leigh et al. |
| 2005/0024831 | A1 | 2/2005 | Phillips et al. |
| 2006/0005980 | A1 | 1/2006 | Garner |
| 2006/0077776 | A1 | 4/2006 | Matsushima |
| 2006/0171119 | A1 * | 8/2006 | Baldwin, Jr. ...... H05K 7/20672 361/700 |
| 2006/0196640 | A1 | 9/2006 | Siu |
| 2007/0042514 | A1 | 2/2007 | Wu et al. |
| 2007/0209782 | A1 | 9/2007 | Wyatt et al. |
| 2007/0263355 | A1 | 11/2007 | Yu et al. |
| 2008/0013283 | A1 | 1/2008 | Gilbert et al. |
| 2008/0024991 | A1 * | 1/2008 | Colbert ............... H01L 23/4093 361/704 |
| 2008/0043442 | A1 | 2/2008 | Strickland et al. |
| 2008/0055848 | A1 | 3/2008 | Hamburgen et al. |
| 2008/0123297 | A1 * | 5/2008 | Tilton ................ H05K 7/20345 361/700 |
| 2009/0021908 | A1 | 1/2009 | Patel et al. |
| 2009/0027856 | A1 * | 1/2009 | McCoy ..................... G06F 1/20 361/699 |
| 2009/0260777 | A1 | 10/2009 | Attlesey |
| 2009/0262495 | A1 | 10/2009 | Neudorfer |
| 2009/0284924 | A1 | 11/2009 | Konshak et al. |
| 2010/0019488 | A1 | 1/2010 | Weimer |
| 2010/0032142 | A1 | 2/2010 | Copeland et al. |
| 2010/0073863 | A1 | 3/2010 | Matsushima |
| 2010/0103618 | A1 * | 4/2010 | Campbell .......... H05K 7/20236 361/699 |
| 2010/0107658 | A1 | 5/2010 | Cockrell |
| 2011/0176273 | A1 | 7/2011 | Olsen |
| 2011/0182033 | A1 | 7/2011 | Tissot et al. |
| 2011/0277967 | A1 | 11/2011 | Fried et al. |
| 2011/0315353 | A1 * | 12/2011 | Campbell .......... H05K 7/20809 165/104.31 |
| 2011/0317367 | A1 * | 12/2011 | Campbell ............... H05K 7/203 361/700 |
| 2012/0097370 | A1 | 4/2012 | Correa |
| 2012/0162918 | A1 | 6/2012 | Thyni |
| 2012/0175094 | A1 | 7/2012 | Rice |
| 2012/0268877 | A1 | 10/2012 | Rice |
| 2012/0291465 | A1 | 11/2012 | Kashirajima |
| 2013/0027884 | A1 * | 1/2013 | Campbell .......... H05K 7/20309 361/700 |
| 2013/0032310 | A1 * | 2/2013 | Jaena ...................... F28D 15/02 165/104.25 |
| 2013/0107455 | A1 | 5/2013 | Cottet |
| 2013/0186494 | A1 | 7/2013 | Geisel |
| 2013/0228313 | A1 | 9/2013 | Fried |
| 2013/0312839 | A1 | 11/2013 | Shelnutt et al. |
| 2013/0312934 | A1 * | 11/2013 | Yasui ................... G05D 23/025 165/96 |
| 2014/0014303 | A1 | 1/2014 | Rice et al. |
| 2014/0049908 | A1 | 2/2014 | Eriksen |
| 2014/0085808 | A1 * | 3/2014 | Tung ........................ G06F 1/20 361/679.47 |
| 2014/0146466 | A1 | 5/2014 | Lau et al. |
| 2014/0321050 | A1 * | 10/2014 | Sato ......................... G06F 1/20 361/679.47 |
| 2015/0029658 | A1 | 1/2015 | Yairi |
| 2015/0048950 | A1 * | 2/2015 | Zeighami ............. G08B 21/182 340/605 |
| 2015/0230366 | A1 | 8/2015 | Shedd |
| 2015/0233511 | A1 | 8/2015 | Lemay |
| 2015/0305209 | A1 * | 10/2015 | Inaba ...................... F28D 15/06 361/679.47 |
| 2015/0351286 | A1 | 12/2015 | Sakamoto |
| 2015/0351290 | A1 | 12/2015 | Shedd |
| 2016/0014933 | A1 * | 1/2016 | Matsunaga ............. B23P 19/00 361/679.53 |
| 2016/0330873 | A1 * | 11/2016 | Farshchian ........ H05K 7/20809 |
| 2016/0381839 | A1 | 12/2016 | Farshchian |
| 2017/0105313 | A1 | 4/2017 | Shedd |
| 2017/0177041 | A1 | 6/2017 | Shelnutt |
| 2017/0234623 | A1 | 8/2017 | Fried |

(56) References Cited

U.S. PATENT DOCUMENTS

| | | | |
|---|---|---|---|
| 2017/0245392 A1 | 8/2017 | Bilski, Jr. | |
| 2017/0245396 A1* | 8/2017 | Bilski, Jr. | .......... H05K 7/20545 |
| 2017/0280585 A1 | 9/2017 | Shoujiguchi | |
| 2017/0311485 A1 | 10/2017 | Yoshikawa | |
| 2018/0042140 A1* | 2/2018 | Pan | .................... H05K 7/20327 |
| 2018/0352645 A1* | 12/2018 | Ho | ...................... F28D 15/0233 |

FOREIGN PATENT DOCUMENTS

| | | |
|---|---|---|
| CN | 202632192 U | 12/2012 |
| CN | 203136417 U | 8/2013 |
| CN | 103430644 A | 12/2013 |
| CN | 103688606 | 3/2014 |
| CN | 103733746 A | 4/2014 |
| CN | 103838337 | 6/2014 |
| EP | 1669710 | 6/2006 |
| EP | 2170030 | 3/2010 |
| JP | 2010-032174 | 2/2010 |
| WO | WO 2002/077547 | 10/2002 |
| WO | WO 2007/012108 | 2/2007 |
| WO | WO 2011/081620 | 7/2011 |
| WO | WO 2012/164261 | 12/2012 |
| WO | WO 2014/132592 | 9/2014 |
| WO | WO 2015/004920 | 1/2015 |

OTHER PUBLICATIONS

CN Office Action in Chinese Application No. 201911018863, dated Jun. 23, 2020, 16 pages (with English translation).

Extended European Search Report in European Application No. 20183637.6, dated Oct. 9, 2020, 11 pages.

Andie Hioki, "The Cray-1 Supercomputer" San Jose State University, 2002, retrieved on Sep. 8, 2010 from http://www.openloop.com/education/classes/sjsu_engdengr_compOrg/spring2002/studentProjects/Andie_Hioki/Cray1withAdd.htm, 16 pages.

Austin Modine, "Remembering the CRAY-1 When Computers and Furniture Collide" The Register, Jan. 5, 2008, retrieved on Sep. 8, 2010 from http://www.theregister.co.uk/2008/01/05/tob_cray1/print.html, 7 pages.

CN Office Action issued in Chinese Application No. 201680025205.2, dated Mar. 4, 2019, 34 pages (with English translation).

CoolIt Systems, "Rack DCLC—Product Guide," 2009, 8 pages.

Emad Samadiani et al., U.S. Appl. No. 14/494,216, filed Sep. 23, 2014, 62 pages.

Gregory P. Imwalle et al., U.S. Appl. No. 14/493,672, filed Sep. 23, 2014, 43 pages.

International Search Report and Written Opinion in International Application No. PCT/US2016/030563, dated Aug. 17, 2016, 14 pages.

James S. Kolodzey, "CRAY-1 Computer Technology" IEEE Transactions on Components, Hybrids, and Manufacturing Technology, vol. CHMT-4, No. 2, Jun. 1981, pp. 181-186.

Jeremy Rice et al., U.S. Appl. No. 14/137,258, filed Dec. 20, 2013, 42 pages.

Madhu Krishnan Iyengar et al., U.S. Appl. No. 14/534,566, filed Nov. 6, 2014, 48 pages.

Richard M. Russell, "The CRAY-1 Computer System" Communications of the ACM, vol. 21, No. 1, Jan. 1978, pp. 63-72.

Soheil Farshchian et al., U.S. Appl. No. 14/012,537, filed Aug. 28, 2013, 27 pages.

TW Office Action issued in Taiwanese Application No. 105113869, dated Apr. 19, 2017, 6 pages (with English Translation).

\* cited by examiner

COOLING ELECTRONIC DEVICES IN A DATA CENTER

CROSS-REFERENCE TO RELATED APPLICATION

This application is a continuation of, and claims priority under 35 U.S.C. § 120 to, U.S. patent application Ser. No. 14/703,566, filed on May 4, 2015, the entire contents of the previous application is incorporated by reference herein.

TECHNICAL FIELD

This disclosure relates to systems and methods for providing cooling to electronic equipment, such as computer server racks and related equipment in computer data centers, with a thermosiphon system.

BACKGROUND

Computer users often focus on the speed of computer microprocessors (e.g., megahertz and gigahertz). Many forget that this speed often comes with a cost—higher power consumption. This power consumption also generates heat. That is because, by simple laws of physics, all the power has to go somewhere, and that somewhere is, in the end, conversion into heat. A pair of microprocessors mounted on a single motherboard can draw hundreds of watts or more of power. Multiply that figure by several thousand (or tens of thousands) to account for the many computers in a large data center, and one can readily appreciate the amount of heat that can be generated. The effects of power consumed by the critical load in the data center are often compounded when one incorporates all of the ancillary equipment required to support the critical load.

Many techniques may be used to cool electronic devices (e.g., processors, memories, networking devices, and other heat-generating devices) that are located on a server or network rack tray. For instance, forced convection may be created by providing a cooling airflow over the devices. Fans located near the devices, fans located in computer server rooms, and/or fans located in ductwork in fluid communication with the air surrounding the electronic devices, may force the cooling airflow over the tray containing the devices. In some instances, one or more components or devices on a server tray may be located in a difficult-to-cool area of the tray; for example, an area where forced convection is not particularly effective or not available.

The consequence of inadequate and/or insufficient cooling may be the failure of one or more electronic devices on the tray due to a temperature of the device exceeding a maximum rated temperature. While certain redundancies may be built into a computer data center, a server rack, and even individual trays, the failure of devices due to overheating can come at a great cost in terms of speed, efficiency, and expense.

Thermosiphons are heat exchangers that operate using a fluid that undergoes a phase change. A liquid form of the fluid is vaporized in an evaporator, and heat is carried by the vapor form of the fluid from the evaporator to a condenser. In the condenser, the vapor condenses, and the liquid form of the fluid is then returned via gravity to the evaporator. Thus, the fluid circulates between the evaporator and the condenser without need of a mechanical pump.

SUMMARY

This disclosure describes implementations of a thermosiphon system that cools electronic heat-generating devices mounted in a server rack of a data center. The thermosiphon system includes multiple evaporator modules that are in thermal contact with, or may be placed into thermal contact with, the heat-generating devices. When in thermal contact, solid surface components of the evaporator modules and heat-generating devices, respectively, may be placed into physical contact (through a thermal interface material or otherwise) to create a thermal interface through which heat flows from the heat-generating devices to the working fluid (e.g., liquid phase) circulated in the evaporator modules. A liquid phase of a working fluid is circulated (e.g., naturally) through the evaporator modules, into which heat from the heat-generating devices is transferred. As the heat is transferred to the working fluid, the liquid phase changes to a vapor phase or a mixed vapor-liquid phase (e.g., depending on the amount of transferred heat). The vapor, or mixed, phase circulates to a condenser module of the thermosiphon system, where it is changed back to the liquid phase by a cooling fluid that is circulated through the condenser module. In some aspects, the condenser module may be mounted to the server rack, such as to a top surface of the server rack. In some aspects, there may be a single condenser module fluidly coupled to the multiple evaporator modules. In some aspects, a ratio of condenser modules to evaporator modules in the thermosiphon system may be less than one.

In an example implementation, a data center thermosiphon cooling system includes a plurality of evaporator modules, each evaporator module configured to thermally couple to one or more heat-generating devices mountable in a rack of a data center; a condenser module that includes a heat transfer surface and is mounted external to the rack; and a plurality of transport members. Each transport member includes a liquid conduit that fluidly couples an inlet of a respective evaporator module to deliver a liquid phase of a working fluid from the condenser to the respective evaporator; and a vapor conduit that fluidly couples an outlet of the respective evaporator module to the condenser to deliver a mixed-phase of the working fluid from the respective evaporator to the condenser, the mixed-phase of the working fluid including heat transferred from the one or more heat-generating devices to the working fluid through the respective evaporator.

In a first aspect combinable with the example implementation, the condenser module is mounted on a top surface of the rack.

A second aspect combinable with any of the previous aspects further includes a liquid header fluidly coupled to each of the liquid conduits and to an outlet of the condenser module.

A third aspect combinable with any of the previous aspects further includes a vapor header fluidly coupled to each of the vapor conduits and an inlet of the condenser module.

In a fourth aspect combinable with any of the previous aspects, the liquid and vapor headers are mounted external to the rack.

A fifth aspect combinable with any of the previous aspects further includes a respective fluid disconnect that couples each liquid conduit to the liquid header.

In a sixth aspect combinable with any of the previous aspects, each respective fluid disconnect is configured to decouple the respective evaporator module from the condenser module and seal the liquid phase of the working fluid in at least one of the respective evaporator module or the respective liquid conduit.

In a seventh aspect combinable with any of the previous aspects, the fluid disconnect includes an orifice configured to meter an amount of the liquid phase of the working fluid to the respective evaporator.

In an eighth aspect combinable with any of the previous aspects, the condenser module includes an air-cooled condenser.

In a ninth aspect combinable with any of the previous aspects, the air-cooled condenser includes one or more fans positioned to circulate a cooling airflow over the heat transfer surface.

In a tenth aspect combinable with any of the previous aspects, the condenser module includes a liquid-cooled condenser including a cooling liquid inlet and a cooling liquid outlet.

In an eleventh aspect combinable with any of the previous aspects, the condenser module includes a single condenser heat transfer coil.

A twelfth aspect combinable with any of the previous aspects further includes a plurality of tray positioners.

In a thirteenth aspect combinable with any of the previous aspects, each tray positioner configured to urge one or more heat-generating devices supported on a respective tray assembly and a respective evaporator module into thermal contact.

In a fourteenth aspect combinable with any of the previous aspects, each respective tray assembly includes a vertically-mountable tray assembly.

In a fifteenth aspect combinable with any of the previous aspects, each tray positioner includes a cam assembly.

In another example implementation, a method for cooling heat-generating electronic devices in a data center includes flowing a liquid phase of a working fluid from a condenser module of a thermosiphon system that is mounted external to a server rack in a data center to a plurality of transport members of the thermosiphon system; flowing the liquid phase of the working fluid from the plurality of transport members to a plurality of evaporator modules of the thermosiphon system, each of the evaporator modules thermally coupled to one or more heat-generating devices mounted in the inner volume of the rack; receiving heat from the one or more heat-generating devices in the liquid phase of the working fluid to boil a portion of the liquid phase of the working fluid; and flowing a mixed phase of the working fluid from the plurality of evaporator modules, through the plurality of transport members, to the condenser module.

A first aspect combinable with the example implementation further includes flowing the mixed phase of the working fluid to the condenser module mounted on a top surface of the server rack.

A second aspect combinable with any of the previous aspects further includes flowing the liquid phase through a liquid header from an outlet of the condenser module and to a respective liquid conduit in each of the plurality of transport members.

A third aspect combinable with any of the previous aspects further includes flowing the mixed phase through a vapor header to an inlet of the condenser module from a respective vapor conduit in each of the plurality of transport members.

A fourth aspect combinable with any of the previous aspects further includes flowing the liquid phase of the working fluid through a respective fluid disconnect that couples each liquid conduit to the liquid header.

A fifth aspect combinable with any of the previous aspects further includes operating the respective fluid disconnect to fluidly decouple the liquid conduit from the liquid header and seal the liquid phase of the working fluid in at least one of the respective evaporator module or the respective liquid conduit.

A sixth aspect combinable with any of the previous aspects further includes circulating a flow of cooling air over the condenser module to change the mixed phase of the working fluid to the liquid phase of the working fluid.

A seventh aspect combinable with any of the previous aspects further includes circulating a flow of cooling liquid through a cooling coil of the condenser module to change the mixed phase of the working fluid to the liquid phase of the working fluid.

In an eighth aspect combinable with any of the previous aspects, the condenser module includes a single condenser heat transfer coil.

A ninth aspect combinable with any of the previous aspects further includes adjusting a position of at least one of a respective tray assembly that supports one or more heat-generating devices and a particular evaporator module associated with the respective tray assembly; and based on the adjusting, urging the one or more heat-generating devices into thermal contact with the particular evaporator module.

In another example implementation, a server rack thermosiphon system includes a plurality of evaporators, each evaporator including a thermal interface for one or more heat-generating server rack devices; at least one condenser mounted to an external structure of a server rack, the condenser including a fluid-cooled heat transfer module; a liquid conduit that fluidly couples each of the evaporators to the condenser to deliver a liquid phase of a working fluid from the condenser to the evaporators; and a vapor conduit that fluidly couples each of the evaporators to the condenser to deliver a mixed phase of the working fluid from the evaporators to the condenser.

In a first aspect combinable with the example implementation, a ratio of the at least one condenser to the plurality of evaporators is less than one.

A second aspect combinable with any of the previous aspects further includes a plurality of fluid disconnects that directly couple the liquid conduit to the evaporators.

In a third aspect combinable with any of the previous aspects, each fluid disconnect is configured to decouple one of the evaporators from the condenser and seal the liquid phase of the working fluid in at least one of the decoupled evaporator or the liquid conduit.

In a fourth aspect combinable with any of the previous aspects, the at least one condenser includes an air-cooled condenser that includes a heat transfer coil and a fan.

In a fifth aspect combinable with any of the previous aspects, the plurality of evaporators include a plurality of fluid channels that each include a liquid phase inlet and a liquid phase outlet.

A sixth aspect combinable with any of the previous aspects further includes a plurality of server shells that at least partially enclose a plurality of server boards that support the one or more heat-generating server rack devices, the server shells defining the plurality of fluid channels therebetween.

A seventh aspect combinable with any of the previous aspects further includes at least one server board adjustment assembly positioned to urge one or more server boards into thermal contact with an interior surface of a server shell.

Various implementations of a data center cooling system according to the present disclosure may include one, some, or all of the following features. For example, the data center cooling system includes a server rack scaled thermosiphon system that cools heat-generating electronic devices (e.g., processors, network devices, memory modules, and otherwise) in a server rack without pumping or compression equipment, thereby requiring less input power. As another example, the thermosiphon system may reduce a cooling system power requirements of a dense rack, which may result in an improved power usage effectiveness (PUE) of a data center. As another example, a thermosiphon system that uses a two-phase (e.g., liquid and vapor/mixed phase) cooling system may maintain or help maintain the components at a tight temperature range due to the thermodynamic properties of the refrigerant. As yet another example, the thermosiphon system may more efficiently expel heat from the server rack to an ambient workspace to minimize cooling losses. Further, the thermosiphon system may require less maintenance and exhibit reliability advantages as compared to other cooling systems, such as immersion systems. Further, the thermosiphon system may include a closed loop cooling fluid, thereby providing for removal and maintenance of particular server boards without disruption of cooling other servers in the rack. As yet a further example, the thermosiphon system may be largely self-contained in a server rack footprint, thereby minimizing floor space usage. The thermosiphon system may also be tailored to a particular cooling power criteria, e.g., by selecting a particular refrigerant as a working fluid. Further, a closed loop system of the thermosiphon system may physically separate the electronic equipment from the cooling fluid (e.g., refrigerant), thereby allowing standard electronic components to be employed. As another example, the thermosiphon system may cool high power heat-generating components (e.g., processors and otherwise) with a passive, pump-less system that uses less energy than forced circulation cooling systems. The thermosiphon system may also provide higher cooling capability through a two-phase boiling of a working fluid to cool the heat-generating devices as compared to single-phase cooling systems (e.g., systems in which the working fluid does not change phase to cool the devices).

The details of one or more embodiments are set forth in the accompanying drawings and the description below. Other features, objects, and advantages will be apparent from the description and drawings, and from the claims.

DETAILED DESCRIPTION

Figure 1:
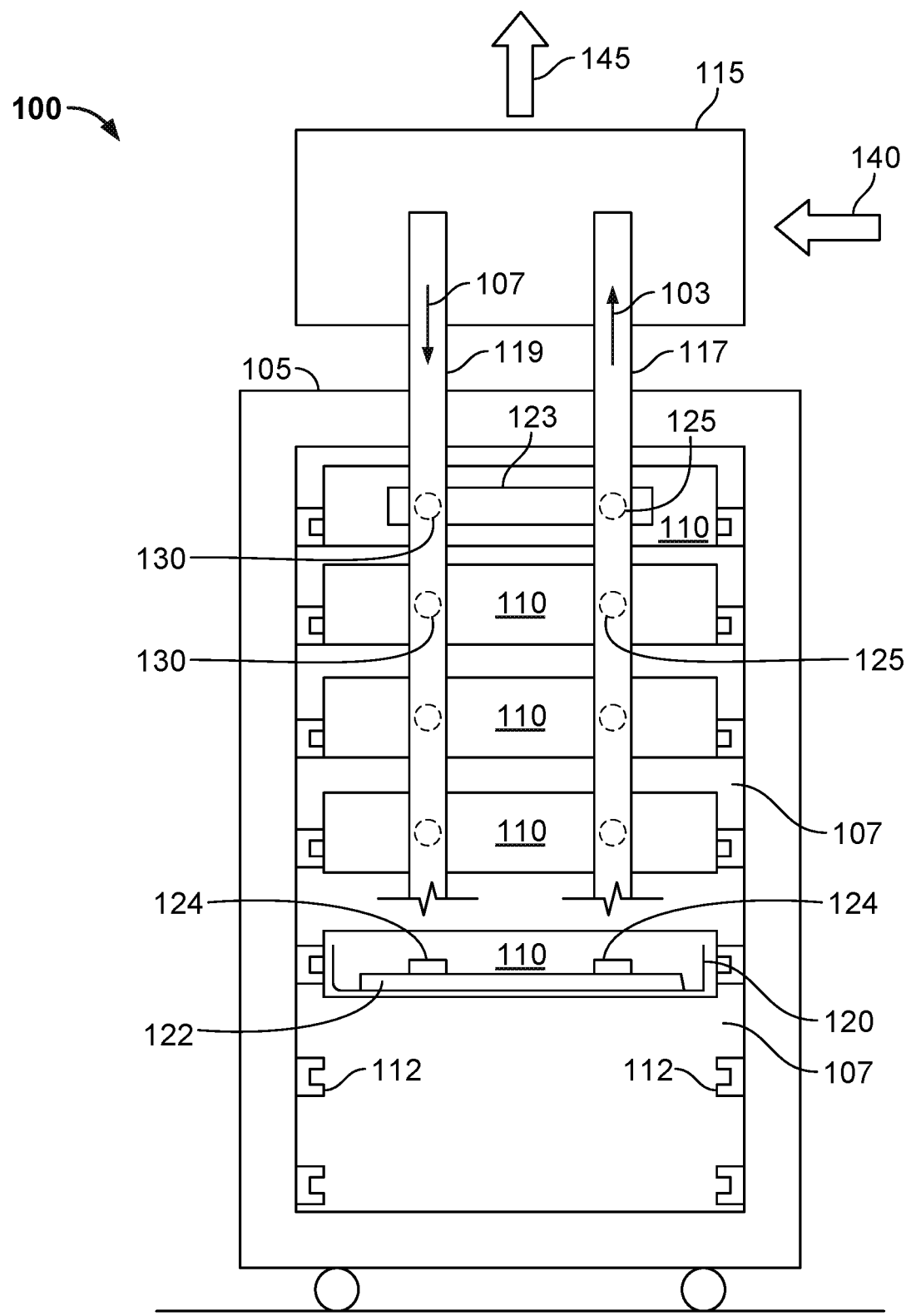
FIG. 1 illustrates a schematic view of a server rack used in a data center environment that includes an example implementation of a thermosiphon cooling system.

FIG. 1 illustrates an example system 100 that includes a server rack 105, e.g., a 13 inch or 19 inch server rack, and multiple server rack sub-assemblies 110 mounted within the rack 105. Although a single server rack 105 is illustrated, server rack 105 may be one of a number of server racks within the system 100, which may include a server farm or a co-location facility that contains various rack mounted computer systems. Also, although multiple server rack sub-assemblies 110 are illustrated as mounted within the rack 105, there might be only a single server rack sub-assembly. Generally, the server rack 105 defines multiple slots 107 that are arranged in an orderly and repeating fashion within the server rack 105, and each slot 107 is a space in the rack into which a corresponding server rack sub-assembly 110 can be placed and removed. For example, the server rack sub-assembly can be supported on rails 112 that project from opposite sides of the rack 105, and which can define the position of the slots 107.

The slots 107, and the server rack sub-assemblies 110, can be oriented with the illustrated horizontal arrangement (with respect to gravity). Alternatively, the slots 107, and the server rack sub-assemblies 110, can be oriented vertically (with respect to gravity), although this would require some reconfiguration of the evaporator and condenser structures described below. Where the slots are oriented horizontally, they may be stacked vertically in the rack 105, and where the slots are oriented vertically, they may be stacked horizontally in the rack 105.

Server rack 105, as part of a larger data center for instance, may provide data processing and storage capacity. In operation, a data center may be connected to a network, and may receive and respond to various requests from the network to retrieve, process, and/or store data. In operation, for example, the server rack 105 typically facilitates the communication of information over a network with user interfaces generated by web browser applications of users who request services provided by applications running on computers in the datacenter. For example, the server rack 105 may provide or help provide a user who is using a web browser to access web sites on the Internet or the World Wide Web.

The server rack sub-assembly 110 may be one of a variety of structures that can be mounted in a server rack. For example, in some implementations, the server rack sub-assembly 110 may be a "tray" or tray assembly that can be slidably inserted into the server rack 105. The term "tray" is not limited to any particular arrangement, but instead applies to motherboard or other relatively flat structures appurtenant to a motherboard for supporting the motherboard in position in a rack structure. In some implementations, the server rack sub-assembly 110 may be a server chassis, or server container (e.g., server box). In some implementations, the server rack sub-assembly 110 may be a hard drive cage.

As illustrated in FIG. 1, the server rack sub-assembly 110 includes a frame or cage 120, a printed circuit board 122, e.g., a server or motherboard, supported on the frame 120, one or more heat-generating electronic devices 124, e.g., a processor or memory or networking device, mounted on the printed circuit board 122. Although the frame 120, server board 122, and heat-generating electronic devices 124 are only shown on one server rack sub-assembly 110, most or each of the assemblies 110 may include such components. Further, while not specifically shown, the server board 122 may also support other components, such as switch gear, one or more fans, and otherwise.

The frame 120 can include or simply be a flat structure onto which the motherboard 122 can be placed and mounted, so that the frame 120 can be grasped by technicians for moving the motherboard into place and holding it in position within the rack 105. For example, the server rack sub-assembly 110 may be mounted horizontally in the server rack 105 such as by sliding the frame 120 into the slot 107 and over a pair of rails in the rack 105 on opposed sides of the server rack sub-assembly 110—much like sliding a lunch tray into a cafeteria rack. The frame 120 can have other forms (e.g., by implementing it as a peripheral frame around the motherboard) or may be eliminated so that the motherboard itself is located in, e.g., slidably engages, the rack 105. In addition, the frame 120 can include a flat plate and one or more side walls that project upwardly from the edges of the flat plate, and the flat plate could be the floor of a closed-top or open-top box or cage.

The illustrated server rack sub-assembly 110 includes a printed circuit board 122, e.g., a motherboard, on which a variety of components are mounted, including heat-generating electronic devices 124. Although one motherboard 122 is illustrated as mounted on the frame 120, multiple motherboards may be mounted on the frame 120, depending on the needs of the particular application. In some implementations, one or more fans can be placed on the frame 120 so that air enters at the front edge of the server rack sub-assembly 110, closer to the front of the rack 105 when the sub-assembly 110 is installed in the rack 105, flows over the motherboard 122, over some of the heat-generating components on the motherboard 122, and is exhausted from the server rack assembly 110 at the back edge, closer to the back of the rack 105 when the sub-assembly 110 is installed in the rack 105. The one or more fans can be secured to the frame 120 by brackets. Thus, the fans can pull air from within the frame 120 area and push the air after it has been warmed out of the rack 105. An underside of the motherboard 122 can be separated from the frame 120 by a gap.

FIG. 1 illustrates an example implementation of a thermosiphon cooling system that includes multiple evaporators 123 (one evaporator 123 is shown for simplicity) that are fluidly coupled to a condenser 115. The thermosiphon system includes a liquid conduit 119 that fluidly couples the condenser 115 to each evaporator 123 so that a liquid phase 107 of a working fluid (e.g., refrigerant or otherwise) is circulated (e.g., through natural or forced circulation) from the condenser 115 to the evaporators 123. Each evaporator 123 is connected to the liquid conduit 119 with a liquid connector 130.

The thermosiphon system also includes a vapor conduit 117 that fluidly couples the condenser 115 to each evaporator 123 so that a mixed or vapor phase 103 of the working fluid is circulated (e.g., through natural or forced circulation) from the evaporators 123 to the condenser 115. Each evaporator 123 is connected to the vapor conduit 117 with a vapor connector 125.

In this example implementation, natural circulation is employed to move the liquid phase 107 of the working fluid from the condenser 115 to the evaporators 123, and to move the vapor phase 103 of the working fluid from the evaporators 123 to the condenser 115. Thus, the illustrated implementation of system 100 includes no pumps to circulate the working fluid and, further, includes no compressors to implement a mechanical refrigeration vapor compression cycle to cool the working fluid. In alternative implementations, a pump may be positioned in fluid communication with the liquid conduit 119 to forcibly circulate the liquid phase 107 of the working fluid from the condenser 115 to the evaporators 123.

Further, although the liquid conduit 119 and the vapor conduit 117 are illustrated in FIG. 1 as separate conduits, in alternative implementations, a single transport member may fluidly connect the condenser 115 and the evaporators 123. The transport member may include both a liquid pathway and a vapor pathway, with the liquid pathway connected to the evaporators 123 by the liquid connectors 130, and the vapor pathway connected to the evaporators 123 by the vapor connectors 125. Thus, although a single transport member may be used, the liquid phase 107 and the vapor (or mixed) phase 103 of the working fluid are still separated during circulation between the condenser 115 and the evaporators 123.

In this illustrated example, the condenser 115 is positioned external to the server rack 105. For example, the condenser 115 can be mounted on top of the server rack 105, onto a side of the server rack 105, or otherwise positioned to receive a cooling fluid supply 140 and expel a cooling fluid return 145. The cooling fluid may be air or liquid. For example, the cooling fluid supply 140 may be ambient air circulated (e.g., by a fan, not shown) through or across the condenser 115.

Although a single condenser 115 is illustrated in this example, there may be multiple condensers 115. In some aspects, however, there may be a ratio of condensers 115 to evaporators 123 that is less than one. In other words, there may be more evaporators 123 than condensers 115, with each condenser 115 fluidly coupled to multiple evaporators 123. For instance, in an example implementation, there may be two condensers 115 to serve the evaporators 123 for the server rack 105. Thus, each condenser 115 would receive the vapor (or mixed) phase 103 from half (exactly or approximately) of the evaporators 123 and return the liquid phase 103 to the half of the evaporators 123. Other configurations of condensers 115 and evaporators 123 are within the scope of the present disclosure.

In an example operation, each evaporator 123 contacts one or more electronic devices 124 so that heat is drawn by conductive heat transfer from the electronic device 124 to the evaporator 123. For example, the evaporator 123 is in conductive thermal contact with the electronic device 124. In particular, the bottom of the evaporator 123 contacts the top of the electronic device 124. In operation, heat from the electronic device 124 causes the liquid phase 107 of the working fluid in the evaporator 123 to evaporate or change phase from liquid to a mixed phase (e.g., mixed liquid and vapor) or a vapor. The vapor (or mixed) phase 103 then passes through the vapor conduit 117 to the condenser 115. Heat is transferred away from the condenser 115 into the cooling fluid supply 140. The cooling fluid supply 140 may be air or liquid (e.g., chilled or cooled water or glycol, or otherwise). The cooling fluid return 145 may exit the condenser 115 carrying the heat transferred from the electronic devices 124. As heat is transferred away from the vapor (or mixed) phase 103 in the condenser 115, a phase change occurs to change the vapor phase 103 back to the liquid phase 107.

Figure 2:
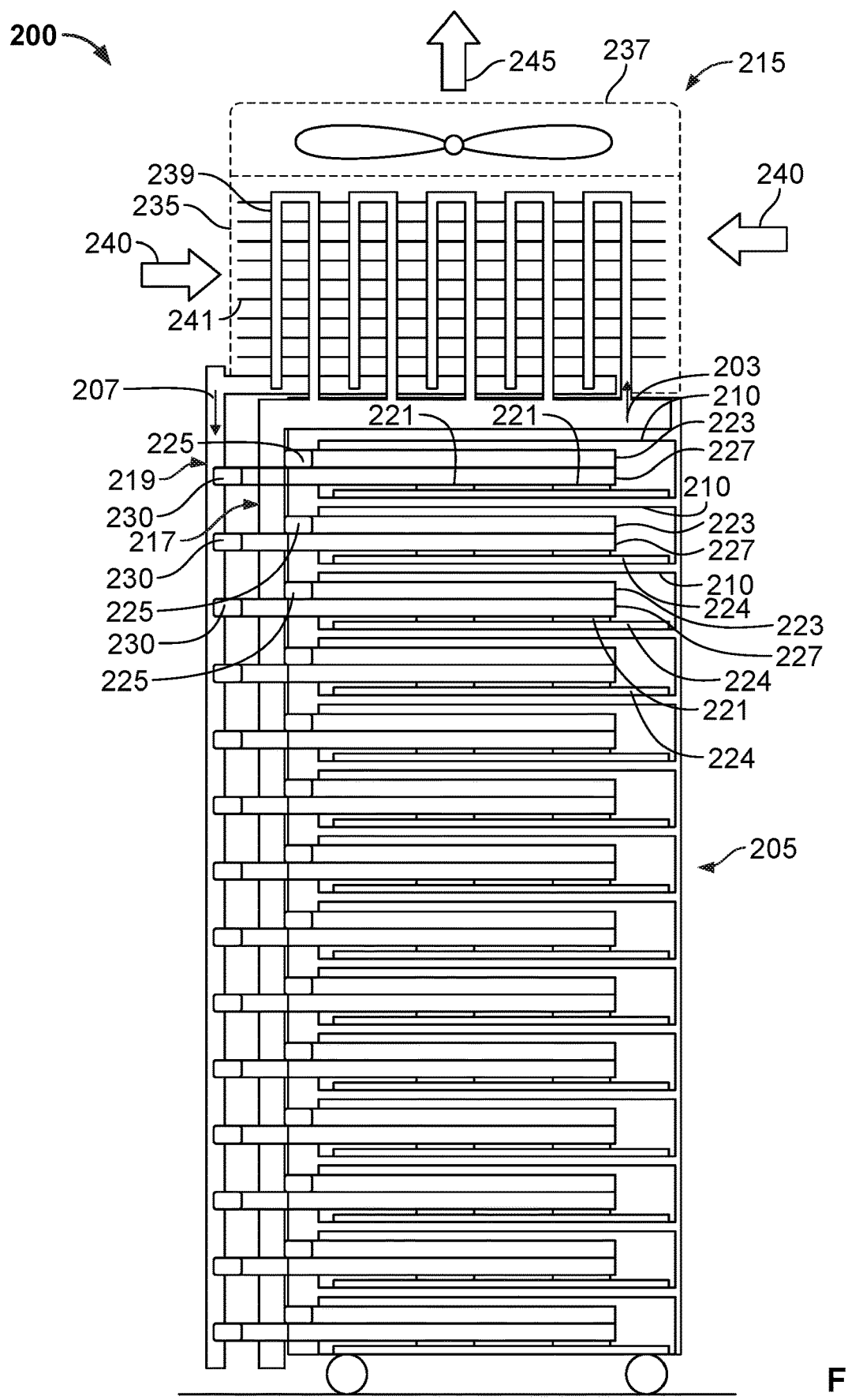
FIG. 2 illustrates a schematic view of a server rack used in a data center environment that includes another example implementation of a thermosiphon cooling system.

FIG. 2 illustrates a schematic view of a server rack used in a data center environment that includes another example implementation of a thermosiphon cooling system 200. The example thermosiphon cooling system 200, as illustrated, includes a condenser 215 that is fluidly coupled to multiple evaporators 227 that are thermally coupled to one or more electronic heat-generating devices 221 in a server rack 205. For instance, in this example implementation, a single air-cooled condenser 215 may be fluidly coupled to the evaporators 227 or, in some aspects, a less than 1-to-1 ratio of condensers 215 may be fluidly coupled to the evaporators 227.

In this illustration, the server rack 205 is shown, e.g., in side view, and includes multiple server rack sub-assemblies 210 mounted within the rack 205. Although a single server rack 205 is illustrated, server rack 205 may be one of a number of server racks within the system 200, which may include a server farm or a co-location facility that contains various rack mounted computer systems. Also, although multiple server rack sub-assemblies 210 are illustrated as mounted within the rack 205, there might be only a single server rack sub-assembly. Generally, the server rack 205 defines multiple slots that are arranged in an orderly and repeating fashion within the server rack 205, and each slot is a space in the rack into which a corresponding server rack sub-assembly 210 can be placed and removed. The slots, and the server rack sub-assemblies 210, can be oriented with the illustrated horizontal arrangement (with respect to gravity) in this example. Where the slots are oriented horizontally, they may be stacked vertically in the rack 205, and where the slots are oriented vertically, they may be stacked horizontally in the rack 205.

Server rack 205, as part of a larger data center for instance, may provide data processing and storage capacity. In operation, a data center may be connected to a network, and may receive and respond to various requests from the network to retrieve, process, and/or store data. In operation, for example, the server rack 205 typically facilitates the communication of information over a network with user interfaces generated by web browser applications of users who request services provided by applications running on computers in the datacenter. For example, the server rack 205 may provide or help provide a user who is using a web browser to access web sites on the Internet or the World Wide Web.

The server rack sub-assembly 210 may be one of a variety of structures that can be mounted in a server rack. For example, in some implementations, the server rack sub-assembly 210 may be a "tray" or tray assembly (e.g., similar or identical to sub-assembly 110) that can be slidably inserted into the server rack 205. In some implementations, the server rack sub-assembly 210 may be a server chassis, or server container (e.g., server box). In some implementations, the server rack sub-assembly 210 may be a hard drive cage.

As illustrated, each server rack sub-assembly 210 includes a printed circuit board 224, e.g., a motherboard, on which a variety of components are mounted, including heat-generating electronic devices 221. Although one motherboard 224 is illustrated as mounted to each sub-assembly 210, multiple motherboards may be mounted in each sub-assembly 210, depending on the needs of the particular application. In some implementations, one or more fans can be coupled to the server board 224 so that air enters at one edge of the server rack sub-assembly 210 (e.g., closer to a front of the rack 210 when the sub-assembly 210 is installed in the rack 205), flows over the motherboard 224, over some of the heat-generating components 221 on the motherboard 224, and is exhausted from the server rack assembly 210 at another edge (e.g., a back edge closer to the back of the rack 205 when the sub-assembly 210 is installed in the rack 205). Thus, the fans can pull air from within the tray subassembly area and push the air after it has been warmed out of the rack 205.

The illustrated implementation of the thermosiphon cooling system 200 includes multiple evaporators 227 (e.g., one or more evaporators 227 per server rack sub-assembly 210) that are fluidly coupled to the condenser 215. The thermosiphon system 200 includes a liquid conduit 219 that fluidly couples the condenser 215 to each evaporator 227 so that a liquid phase 207 of a working fluid (e.g., refrigerant or otherwise) is circulated (e.g., through natural or forced circulation) from the condenser 215 to the evaporators 227. Each evaporator 227 is connected to the liquid conduit 219 with a liquid connector 230.

The thermosiphon system 200 also includes a vapor conduit 217 that fluidly couples the condenser 215 to each evaporator 227 so that a mixed or vapor phase 203 of the working fluid is circulated (e.g., through natural or forced circulation) from the evaporators 227 to the condenser 215. Each evaporator 227 is connected to the vapor conduit 217 with a vapor connector 225.

One or more of the connectors (e.g., the liquid connectors 230, the vapor connectors 225, or both) may include a shut-off valve or device that fluidly isolates the respective evaporator 227 from the condenser 215. For instance, the liquid connectors 230 (or vapor connectors 225 or both) may be adjustable between an open and closed position. In the open position, the respective evaporator 227 is fluidly connected to receive the liquid phase 207 of the working fluid from the condenser 215. In the closed position, the respective evaporator 227 is fluidly decoupled from the condenser 215 such that the liquid phase 207 of the working fluid does not flow from the condenser 215 to the evaporator 227 (or evaporators 227). In some aspects, in the closed position, the liquid connector 225 may isolate and seal the liquid phase 207 in the evaporator 227 (or evaporators 227), thereby allowing removal of the server rack sub-assembly 210 along with the evaporator 227 (or evaporators 227) as a single unit from the server rack 205. In alternative aspects, in the closed position, the liquid connector 225 may isolate and seal the liquid phase 207 in the condenser 215, thereby allowing removal of the server rack sub-assembly 210 along with the evaporator 227 (or evaporators 227) as a single unit from the server rack 205.

In some aspects, one or more of the connectors (e.g., the liquid connectors 230, the vapor connectors 225, or both) may also be used to tailor or control an amount of flow of the liquid phase 207 to the evaporators 227. For example, in some aspects, one or more of the liquid connectors 230 may also (e.g., in addition to a coupling/isolation device) act as an orifice that meters an amount of the liquid phase 207 to the evaporator 227. In some examples, the connector 230 may be a fixed orifice that allows a particular flow rate (e.g., maximum flow rate) of the liquid phase 207 to enter the evaporator 227. In other examples, the connector 230 may include or be a variable orifice that is adjustable, e.g., based on an amount of heat output from one or more heat-generating devices 221 thermally coupled to the evaporator 227. For example, as the heat output of the one or more heat-generating devices 221 increases, the variable orifice may allow an increased flow of liquid phase 207 into the evaporator 227. As the heat output of the one or more heat-generating devices 221 decreases, the variable orifice may restrict the flow of liquid phase 207 into the evaporator 227. Thus, the liquid connector 230 may be used to better match an amount of liquid phase 207 provided to the evaporator 227 to an amount of heat output from the one or more heat-generating devices 221.

In this example implementation, natural circulation is employed to move the liquid phase 207 of the working fluid from the condenser 215 to the evaporators 227, and to move the vapor phase 203 of the working fluid from the evaporators 227 to the condenser 215. Thus, the illustrated implementation of system 200 includes no pumps to circulate the working fluid and, further, includes no compressors to implement a mechanical refrigeration vapor compression cycle to cool the working fluid. In alternative implementations, a pump may be positioned in fluid communication with the liquid conduit 219 to forcibly circulate the liquid phase 207 of the working fluid from the condenser 215 to the evaporators 227.

Further, although the liquid conduit 219 and the vapor conduit 217 are illustrated in FIG. 2 as separate conduits, in alternative implementations, a single transport member may fluidly connect the condenser 215 and the evaporators 227. The transport member may include both a liquid pathway and a vapor pathway, with the liquid pathway connected to the evaporators 227 by the liquid connectors 230, and the vapor pathway connected to the evaporators 227, through vapor stubs 227, by the vapor connectors 225. Thus, although a single transport member may be used, the liquid phase 207 and the vapor (or mixed) phase 203 of the working fluid are still separated during circulation between the condenser 215 and the evaporators 227.

In this illustrated example, the condenser 215 is positioned external to the server rack 205. For example, the condenser 215 can be mounted on top of the server rack 205, onto a side of the server rack 205, or otherwise positioned to receive a cooling fluid supply 240 and expel a cooling fluid return 245. In this example implementation, the condenser 215 is an air-cooled condenser 215, which includes a coil section 235 and a fan section 237. The coil section 235, as shown, includes a condenser coil 239 through which the working fluid is circulated and one or more heat transfer surfaces 241 (e.g., fins) thermally coupled to the coil 239. The coil tube 239 receives the vapor (or mixed) phase 203 of the working fluid from the vapor conduit 217 and, supplies the liquid phase 207 of the working fluid to the liquid conduit 219. The cooling fluid supply 240 may be ambient air circulated through or across the condenser coil 239.

Although a single condenser 215 is illustrated in this example, there may be multiple condensers 215. In some aspects, however, there may be a ratio of condensers 215 to evaporators 227 that is less than one. In other words, there may be more evaporators 227 than condensers 215, with each condenser 215 fluidly coupled to multiple evaporators 227. For instance, in an example implementation, there may be two condensers 215 to serve the evaporators 227 for the server rack 205. Thus, each condenser 215 would receive the vapor (or mixed) phase 203 from half (exactly or approximately) of the evaporators 227 and return the liquid phase 203 to the half of the evaporators 227.

This may allow, in some instances, for redundant cooling of the heat-generating devices 221. For example, in some aspects, there may be multiple evaporators 227 per server rack sub-assembly 210. Each evaporator 227 positioned for the server rack sub-assembly 210 may be in thermal contact (e.g., through a thermal interface or thermal interface material) with a particular heat-generating device 221 (e.g., processor or otherwise) or multiple heat-generating devices 221. Thus, different heat-generating devices 221 may be in thermal contact with different ones of the multiple evaporators 227 for the particular server rack sub-assembly 210. Also, each heat-generating device 221 on a server rack sub-assembly 210 may be in thermal contact with multiple evaporators 227. A failure in one particular evaporator 227 of a server rack sub-assembly 210 may not, therefore, remove cooling for the entire server rack sub-assembly 210 or even a single heat-generating device 221. Further, in aspects in which evaporators 227 of a single server rack sub-assembly 210 are fluidly coupled to different condensers 215 of a system 200 that includes multiple condenser 215, a failure of a single condenser 215 may not remove cooling for the entire server rack sub-assembly 210 or even a single heat-generating device 221.

In an example operation, each evaporator 227 contacts one or more electronic devices 221 so that heat is drawn by conductive heat transfer from the electronic device 221 to the evaporator 227. For example, the evaporator 227 is in conductive thermal contact with the electronic device 221 (or in thermal contact with the device 221 through a thermal interface material). In particular, the bottom of the evaporator 227 contacts the top of the electronic device 221. In operation, heat from the electronic device 221 causes the liquid phase 207 of the working fluid in the evaporator 227 to evaporate or change phase from liquid to a mixed phase (e.g., mixed liquid and vapor) or a vapor. The vapor (or mixed) phase 203 then passes through the vapor stub 223 to the vapor conduit 217 and to the condenser 215. Heat is transferred away from the condenser 215 into the cooling fluid supply 240. For example, the cooling fluid supply 240 may be drawn or circulated by the fan 237 over the condenser coil 239 in order to remove heat from the vapor phase 203 to the cooling fluid supply 240. The cooling fluid return 245 may exit the condenser 215 carrying the heat transferred from the electronic devices 221. As heat is transferred away from the vapor (or mixed) phase 203 in the condenser 215, a phase change occurs to change the vapor phase 203 back to the liquid phase 207. The liquid phase 207 is circulated (e.g., naturally or otherwise) to the liquid conduit 219 to be provided to the evaporators 227 to repeat the process.

Figure 3:
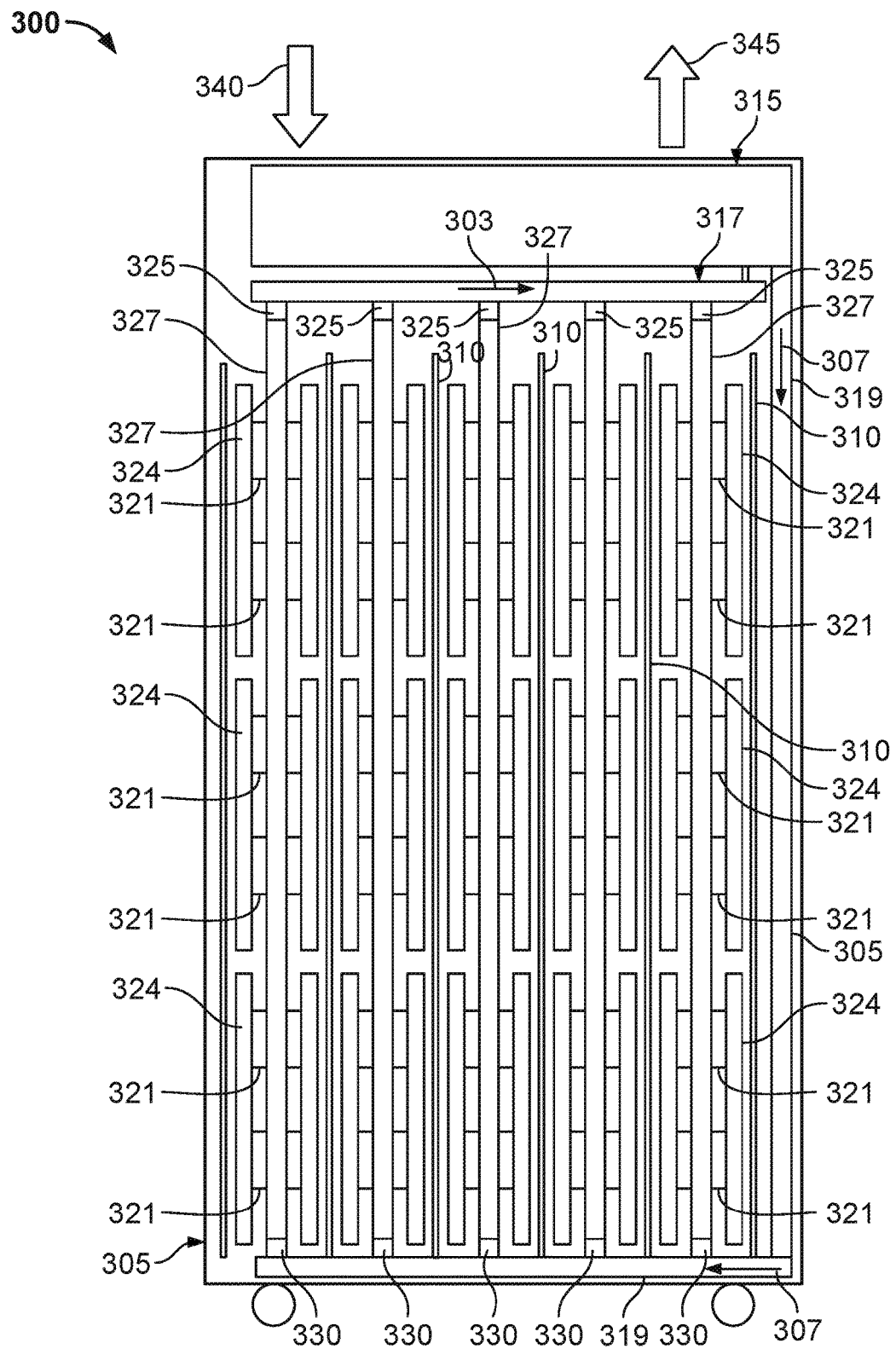
FIG. 3 illustrates a schematic view of a server rack used in a data center environment that includes another example implementation of a thermosiphon cooling system.

FIG. 3 illustrates a schematic view of a server rack used in a data center environment that includes another example implementation of a thermosiphon cooling system 300. The example thermosiphon cooling system 300, as illustrated, includes a condenser 315 that is fluidly coupled to multiple evaporators 327 that are thermally coupled to one or more electronic heat-generating devices 321 in a server rack 305. For instance, in this example implementation, a single condenser 315 may be fluidly coupled to the evaporators 327 or, in some aspects, a less than 1-to-1 ratio of condensers 315 may be fluidly coupled to the evaporators 327. In this illustrated example, the thermosiphon system 300 may be used to cool heat-generating devices on vertically-mounted server rack sub-assemblies in the server rack 305.

In this illustration, the server rack 305 is shown, e.g., in side view, and includes multiple server rack sub-assemblies 310 mounted vertically within the rack 305. Although a single server rack 305 is illustrated, server rack 305 may be one of a number of server racks within the system 300, which may include a server farm or a co-location facility that contains various rack mounted computer systems. Also, although multiple server rack sub-assemblies 310 are illustrated as mounted within the rack 305, there might be only a single server rack sub-assembly. Generally, the server rack 305 defines multiple slots that are arranged in an orderly and repeating fashion within the server rack 305, and each slot is a space in the rack into which a corresponding server rack sub-assembly 310 can be placed and removed. The slots, and the server rack sub-assemblies 310, are oriented in a vertical arrangement (with respect to gravity) in this example.

Server rack 305, as part of a larger data center for instance, may provide data processing and storage capacity. In operation, a data center may be connected to a network, and may receive and respond to various requests from the network to retrieve, process, and/or store data. In operation, for example, the server rack 305 typically facilitates the communication of information over a network with user interfaces generated by web browser applications of users who request services provided by applications running on computers in the datacenter. For example, the server rack 305 may provide or help provide a user who is using a web browser to access web sites on the Internet or the World Wide Web.

The server rack sub-assembly 310 may be one of a variety of structures that can be mounted in a server rack. For example, in some implementations, the server rack sub-assembly 310 may be a "tray" or tray assembly (e.g., similar or identical to sub-assembly 110) that can be slidably inserted into the server rack 305. In some implementations, the server rack sub-assembly 310 may be a server chassis, or server container (e.g., server box). In some implementations, the server rack sub-assembly 310 may be a hard drive cage.

As illustrated, each server rack sub-assembly 310 includes a printed circuit board 324, e.g., a motherboard, on which a variety of components are mounted, including heat-generating electronic devices 321. One or more motherboards 324 are mounted to each sub-assembly 310, multiple motherboards may be mounted in each sub-assembly 310, depending on the needs of the particular application. In some implementations, one or more fans can be coupled to the server board 324 so that air enters at one edge of the server rack sub-assembly 310 (e.g., closer to a front of the rack 310 when the sub-assembly 310 is installed in the rack 305), flows over the motherboard 324, over some of the heat-generating components 321 on the motherboard 324, and is exhausted from the server rack assembly 310 at another edge (e.g., a back edge closer to the back of the rack 305 when the sub-assembly 310 is installed in the rack 305). Thus, the fans can pull air from within the tray subassembly area and push the air after it has been warmed out of the rack 305.

The illustrated implementation of the thermosiphon cooling system 300 includes multiple evaporators 327 (e.g., one or more evaporators 327 per server rack sub-assembly 310) that are fluidly coupled to the condenser 315. The thermosiphon system 300 includes a liquid conduit 319 that fluidly couples the condenser 315 to each evaporator 327 so that a liquid phase 307 of a working fluid (e.g., refrigerant or otherwise) is circulated (e.g., through natural or forced circulation) from the condenser 315 to the evaporators 327. Each evaporator 327 is connected to the liquid conduit 319 with a liquid connector 330. In this example, implementation, the liquid conduit 319 is positioned at or near a bottom of the server rack 305 so that the liquid phase 307 of the working fluid can flow (e.g., by gravity) from the condenser 315 through the conduit 319 to enter a bottom of the evaporators 327.

The thermosiphon system 300 also includes a vapor conduit 317 that fluidly couples the condenser 315 to each evaporator 327 so that a mixed or vapor phase 303 of the working fluid is circulated (e.g., through natural or forced circulation) from the evaporators 327 to the condenser 315. In this example, each evaporator 327 is connected to the vapor conduit 317 with a vapor connector 325.

One or more of the connectors (e.g., the liquid connectors 330, the vapor connectors 325, or both) may include a shut-off valve or device that fluidly isolates the respective evaporator 327 from the condenser 315. For instance, the liquid connectors 330 (or vapor connectors 325 or both) may be adjustable between an open and closed position. In the open position, the respective evaporator 327 is fluidly connected to receive the liquid phase 307 of the working fluid from the condenser 315. In the closed position, the respective evaporator 327 is fluidly decoupled from the condenser 315 such that the liquid phase 307 of the working fluid does not flow from the condenser 315 to the evaporator 327 (or evaporators 327). In some aspects, in the closed position, the liquid connector 325 may isolate and seal the liquid phase 307 in the evaporator 327 (or evaporators 327), thereby allowing removal of the server rack sub-assembly 310 along with the evaporator 327 (or evaporators 327) as a single unit from the server rack 305. In alternative aspects, in the closed position, the liquid connector 325 may isolate and seal the liquid phase 307 in the condenser 315, thereby allowing removal of the server rack sub-assembly 310 along with the evaporator 327 (or evaporators 327) as a single unit from the server rack 305.

In some aspects, one or more of the connectors (e.g., the liquid connectors 330, the vapor connectors 325, or both) may also be used to tailor or control an amount of flow of the liquid phase 307 to the evaporators 327. For example, in some aspects, one or more of the liquid connectors 330 may also (e.g., in addition to a coupling/isolation device) act as an orifice that meters an amount of the liquid phase 307 to the evaporator 327. In some examples, the connector 330 may be a fixed orifice that allows a particular flow rate (e.g., maximum flow rate) of the liquid phase 307 to enter the evaporator 327. In other examples, the connector 330 may include or be a variable orifice that is adjustable, e.g., based on an amount of heat output from one or more heat-generating devices 321 thermally coupled to the evaporator 327. For example, as the heat output of the one or more heat-generating devices 321 increases, the variable orifice may allow an increased flow of liquid phase 307 into the evaporator 327. As the heat output of the one or more heat-generating devices 321 decreases, the variable orifice may restrict the flow of liquid phase 307 into the evaporator 327. Thus, the liquid connector 330 may be used to better match an amount of liquid phase 307 provided to the evaporator 327 to an amount of heat output from the one or more heat-generating devices 321.

In alternative aspects, one, some, or all of the connectors (e.g., connectors 325 and connectors 330) may not be included in order for removal of the server rack sub-assemblies 310 from the server rack 305. For example, a position of each server rack sub-assembly 310, or each server board 324, may be adjusted between an unengaged position in which the heat-generating devices 321 are not in thermal contact with the evaporator 327 (or evaporators 327) and an engaged position in which the heat-generating devices 321 are in thermal contact with the evaporator 327 (or evaporators 327). Thus, in the unengaged position, the server rack sub-assembly 310 or the server board 324 may be removed from the rack 305 (e.g., for servicing or otherwise) without disturbing the thermosiphon cooling system 300.

Figure 4A:
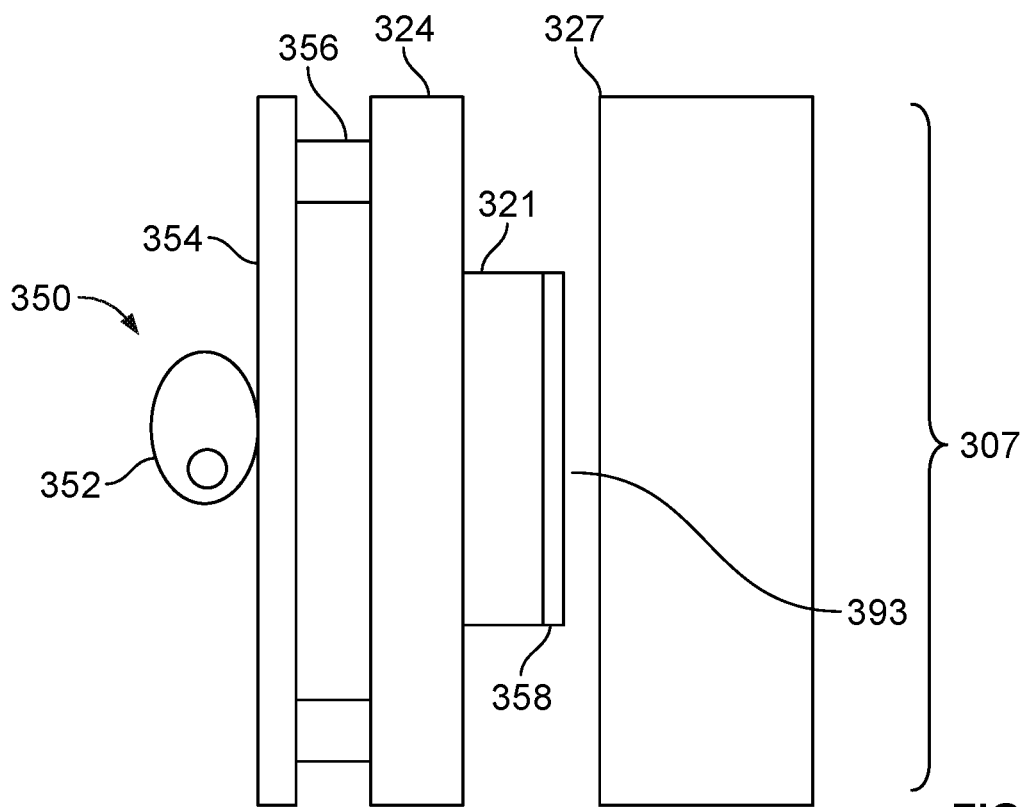
FIGS. 4A-4B illustrate schematic views of an example implementation of a server board adjustment system used in a thermosiphon cooling system for a server rack.
Figure 4B:
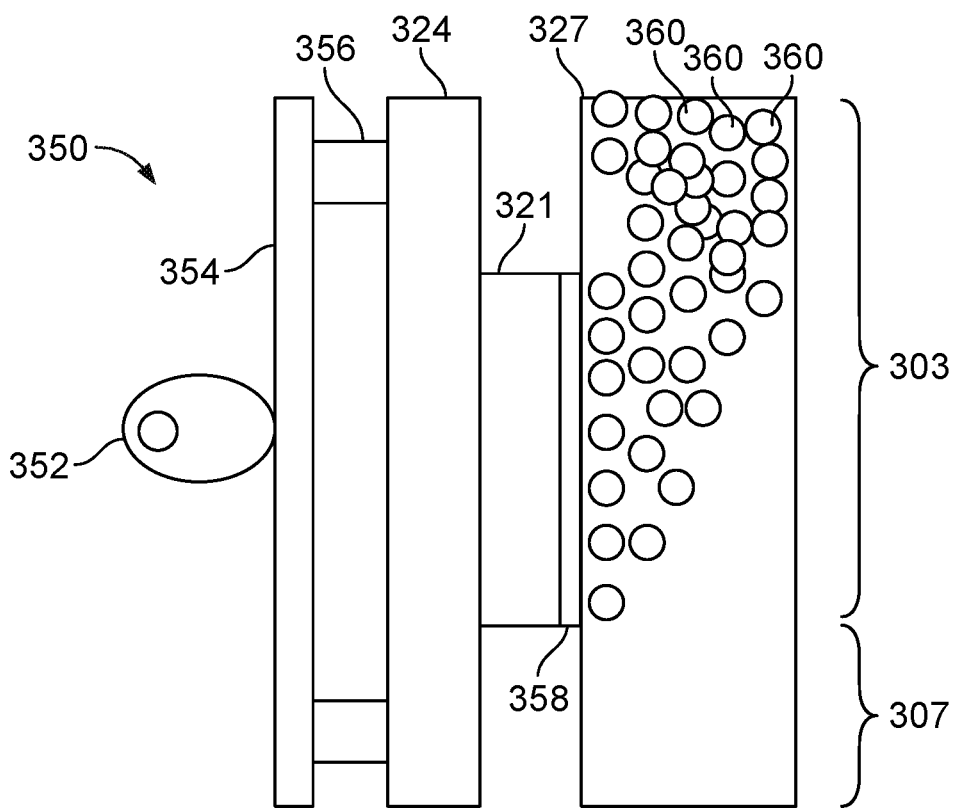

For example, turning briefly to FIGS. 4A-4B, these figures illustrate schematic views of an example implementation of a server board adjustment system 350 used in a thermosiphon cooling system for a server rack. In this example, the server board adjustment system 350 may be used to adjust the server rack sub-assembly 310 or the server board 324 between the unengaged position and the engaged position. In this example, FIG. 4A shows the server rack sub-assembly 310 or the server board 324 in the unengaged position in which there is a gap 393 between the heat-generating device 321 (or a thermal interface material 358 mounted on the heat-generating device 321) and the evaporator 327. The thermal interface material 358, in some aspects, includes a pliable material (e.g., putty, semi-solid, gel, or otherwise) that increases a physical contact area between the heat-generating device 321 and the evaporator 327 (e.g., due to imperfections in the solid surfaces of these components). Further, as heat is transferred through the thermal interface material 358, the material 358 may undergo phase change (e.g., from solid to semi-solid) to further increase the physical contact area (e.g., by flowing into or filling in small gaps between the solid surfaces).

The example server board adjustment system 350 includes a cam 352 coupled to the server rack 305 and positioned to adjust a frame 354 of the server rack sub-assembly 310. The frame 354 supports the server board 324 on members 356. In the unengaged position, the liquid phase 307 circulates through the evaporator 327, as no or negligible heat from the heat-generating device 321 is transferred to the liquid phase 307.

FIG. 4B shows the server rack sub-assembly 310 or the server board 324 in the engaged position in which there is thermal contact between the heat-generating device 321 (or the thermal interface material 358 mounted on the heat-generating device 321) and the evaporator 327. To adjust from the unengaged position to the engaged position, the cam 352 is operated (e.g., by an actuator, motor, or servo controlled by a controller or control system, not shown) to push the frame 354 of the server rack sub-assembly 310 toward the evaporator 327. In pushing the frame 354 (and thus the server board 324 and the heat-generating device 321) towards the evaporator 327, thermal contact between the heat-generating device 321 and the evaporator 327 is achieved to transfer heat to the liquid phase 307 (to boil the liquid phase 307 into bubbles 360 of the vapor phase 303). In some aspects, operation of the cam 352 may be initiated by a signal from a controller that signifies, for instance, that a temperature of the device 321 exceeds a threshold, the server rack sub-assembly 310 is in proper position, or otherwise.

Although FIGS. 4A-4B illustrate an example implementation of a server board adjustment system 350 (e.g., a cam system), other implementations are contemplated by the present disclosure. For example, the server board adjustment system 350 may include a piston device that can be actuated to urge the heat-generating device 321 against the evaporator 327. As another example, an expandable bladder may be actuated to urge the heat-generating device 321 against the evaporator 327. As yet another example, a spring-loaded cam or piston may be actuated to urge the heat-generating device 321 against the evaporator 327.

Moreover, in some aspects, the server board adjustment system 350 may urge the evaporator 327 into thermal engagement with the heat-generating device 321 that remain stationary (exactly or substantially). In some other aspects, the server board adjustment system 350 may urge the evaporator 327 and the heat-generating device 321 into thermal engagement.

Returning to FIG. 3, in this example implementation, natural circulation is employed to move the liquid phase 307 of the working fluid from the condenser 315 to the evaporators 327, and to move the vapor phase 303 of the working fluid from the evaporators 327 to the condenser 315. Thus, the illustrated implementation of system 300 includes no pumps to circulate the working fluid and, further, includes no compressors to implement a mechanical refrigeration vapor compression cycle to cool the working fluid. In alternative implementations, a pump may be positioned in fluid communication with the liquid conduit 319 to forcibly circulate the liquid phase 307 of the working fluid from the condenser 315 to the evaporators 327.

In this illustrated example, the condenser 315 is positioned external to the server rack 305. For example, the condenser 315 can be mounted on top of the server rack 305, onto a side of the server rack 305, or otherwise positioned to receive a cooling fluid supply 340 and expel a cooling fluid return 345. In this example implementation, the condenser 315 is an air-cooled or liquid-cooled condenser 315. Cooling fluid supply 340 (e.g., cooled or ambient air, or chilled or cooled water or glycol) may be circulated through or across the condenser 315.

Although a single condenser 315 is illustrated in this example, there may be multiple condensers 315. In some aspects, however, there may be a ratio of condensers 315 to evaporators 327 that is less than one. In other words, there may be more evaporators 327 than condensers 315, with each condenser 315 fluidly coupled to multiple evaporators 327. For instance, in an example implementation, there may be two condensers 315 to serve the evaporators 327 for the server rack 305. Thus, each condenser 315 would receive the vapor (or mixed) phase 303 from half (exactly or approximately) of the evaporators 327 and return the liquid phase 303 to the half of the evaporators 327.

This may allow, in some instances, for redundant cooling of the heat-generating devices 321. For example, in some aspects, there may be multiple evaporators 327 per server rack sub-assembly 310. Each evaporator 327 positioned for the server rack sub-assembly 310 may be in thermal contact (e.g., through a thermal interface or thermal interface material) with a particular heat-generating device 321 (e.g., processor or otherwise) or multiple heat-generating devices 321. Thus, different heat-generating devices 321 may be in thermal contact with different ones of the multiple evaporators 327 for the particular server rack sub-assembly 310. Also, each heat-generating device 321 on a server rack sub-assembly 310 may be in thermal contact with multiple evaporators 327. A failure in one particular evaporator 327 of a server rack sub-assembly 310 may not, therefore, remove cooling for the entire server rack sub-assembly 310 or even a single heat-generating device 321. Further, in aspects in which evaporators 327 of a single server rack sub-assembly 310 are fluidly coupled to different condensers 315 of a system 300 that includes multiple condenser 315, a failure of a single condenser 315 may not remove cooling for the entire server rack sub-assembly 310 or even a single heat-generating device 321.

In an example operation, each evaporator 327 contacts one or more electronic devices 321 so that heat is drawn by conductive heat transfer from the electronic device 321 to the evaporator 327. For example, the evaporator 327 may be or may be placed into conductive thermal contact with the electronic device 321 (or in thermal contact with the device 321 through a thermal interface material). In particular, the bottom of the evaporator 327 contacts the top of the electronic device 321. In operation, heat from the electronic device 321 causes the liquid phase 307 of the working fluid in the evaporator 327 to evaporate or change phase from liquid to a mixed phase (e.g., mixed liquid and vapor) or a vapor. The vapor (or mixed) phase 303 then passes through the vapor stub 323 to the vapor conduit 317 and to the condenser 315. Heat is transferred away from the condenser 315 into the cooling fluid supply 340. For example, the cooling fluid supply 340 may be drawn or circulated through or into the condenser 315 in order to remove heat from the vapor phase 303 to the cooling fluid supply 340. The cooling fluid return 345 may exit the condenser 315 carrying the heat transferred from the electronic devices 321. As heat is transferred away from the vapor (or mixed) phase 303 in the condenser 315, a phase change occurs to change the vapor phase 303 back to the liquid phase 307. The liquid phase 307 is circulated (e.g., naturally or otherwise) to the liquid conduit 319 to be provided to the evaporators 327 to repeat the process.

Figure 5:
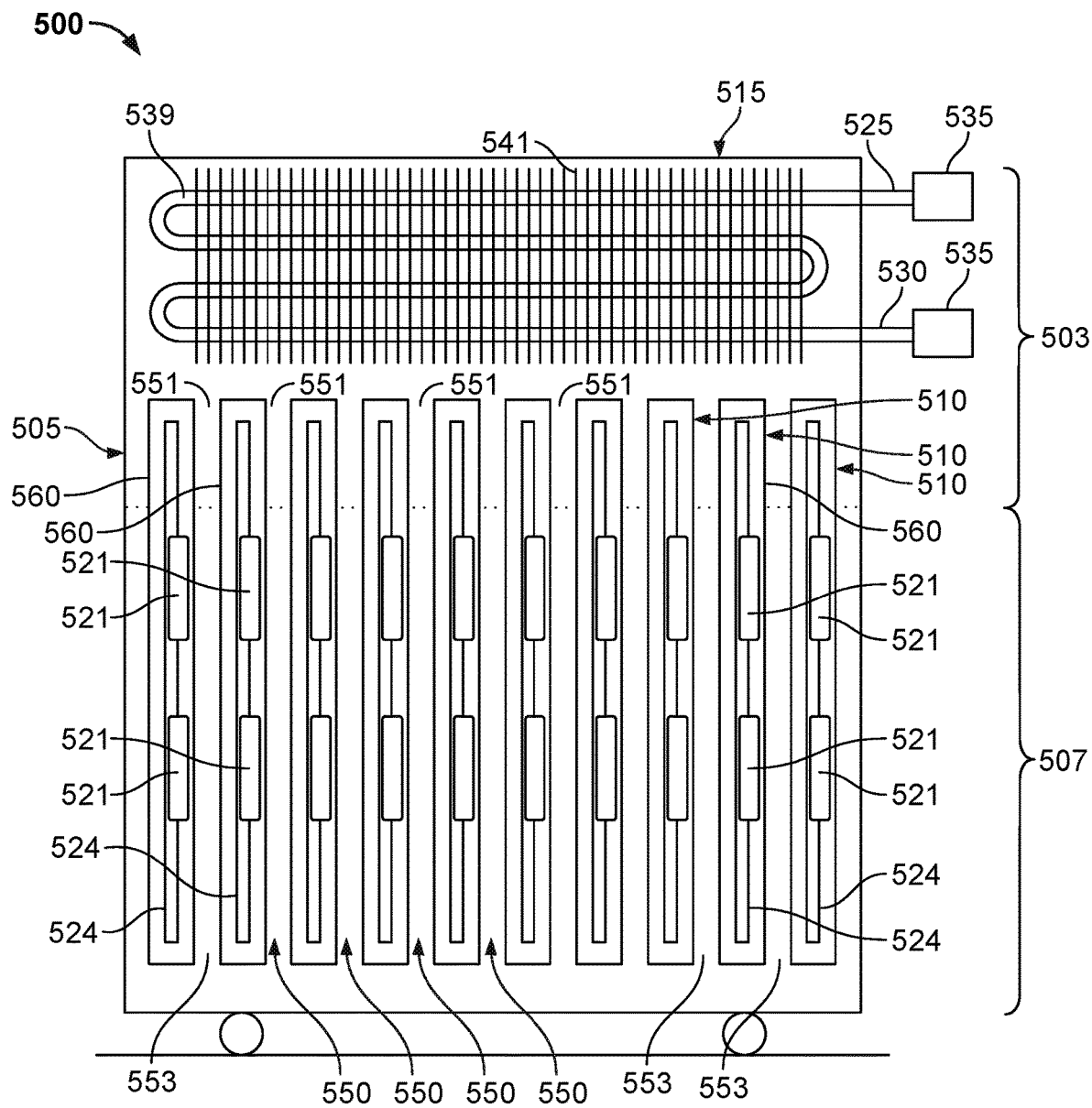
FIG. 5 illustrates a schematic view of a server rack used in a data center environment that includes another example implementation of a thermosiphon cooling system.

FIG. 5 illustrates a schematic view of a server rack 505 used in a data center environment that includes another example implementation of a thermosiphon cooling system 500. The example thermosiphon cooling system 500, as illustrated, includes a condenser 515 that is fluidly coupled to multiple liquid channels that form evaporator sections 550 that are thermally coupled to one or more electronic heat-generating devices 521 in a server rack 505. For instance, in this example implementation, a single air-cooled condenser 515 may be fluidly coupled to the evaporators 550 or, in some aspects, a less than 1-to-1 ratio of condensers 515 may be fluidly coupled to the evaporators 550. In this example system 500, a working fluid used to cool the electronic heat-generating devices 521 is contained in the server rack 505 but otherwise may be free (e.g., not contained in an enclosed conduit) to migrate through the rack 505, for example, depending on heat being transferred to and from the working fluid. In this example, system, the server boards 524 to which the heat-generating devices 521 are mounted are enclosed (e.g., all or substantially) in respective server shells 560 (e.g., thermally conductive shells). Together, each shell 560 that encloses one or more server boards 524 (as well as multiple heat-generating devices 521) may form a server rack sub-assembly 510. In this example system 500, a liquid-cooled condenser 515 (or condensers 515) may operate to change a vapor (or mixed) phase 503 of the working fluid to a liquid phase 507 of the working fluid.

In this illustration, the server rack 505 is shown, e.g., in side view, and includes multiple server rack sub-assemblies 510 mounted within the rack 505. Although a single server rack 505 is illustrated, server rack 505 may be one of a number of server racks within the system 500, which may include a server farm or a co-location facility that contains various rack mounted computer systems. Also, although multiple server rack sub-assemblies 510 are illustrated as mounted within the rack 505, there might be only a single server rack sub-assembly. Generally, the server rack 505 defines multiple slots that are arranged in an orderly and repeating fashion within the server rack 505, and each slot is a space in the rack into which a corresponding server rack sub-assembly 510 can be placed and removed. The slots, and the server rack sub-assemblies 510, can be oriented with the illustrated vertical arrangement (with respect to gravity) in this example. Where the slots are oriented vertically, they may be stacked horizontally in the rack 505 in alternative implementations.

Server rack 505, as part of a larger data center for instance, may provide data processing and storage capacity. In operation, a data center may be connected to a network, and may receive and respond to various requests from the network to retrieve, process, and/or store data. In operation, for example, the server rack 505 typically facilitates the communication of information over a network with user interfaces generated by web browser applications of users who request services provided by applications running on computers in the datacenter. For example, the server rack 505 may provide or help provide a user who is using a web browser to access web sites on the Internet or the World Wide Web.

The server rack sub-assembly 510 may be one of a variety of structures that can be mounted in a server rack. For example, in some implementations, the server rack sub-assembly 510 may be a "tray" or tray assembly (e.g., similar or identical to sub-assembly 110) that can be slidably inserted into the server rack 505. In some implementations, the server rack sub-assembly 510 may be a server chassis, or server container (e.g., server box). In some implementations, the server rack sub-assembly 510 may be a hard drive cage.

As illustrated, each server rack sub-assembly 510 includes a printed circuit board 524, e.g., a motherboard, on which a variety of components are mounted, including heat-generating electronic devices 521. Although one motherboard 524 is illustrated as mounted to each sub-assembly 510, multiple motherboards may be mounted in each sub-assembly 510, depending on the needs of the particular application. In some implementations, each sub-assembly 510 includes a server board adjustment system as described with reference to FIGS. 4A-4B. In system 500, a server board adjustment system may be used to adjust the server board 524 between an unengaged position and an engaged position. In the unengaged position, there may be a gap between the heat-generating device(s) 521 (or a thermal interface material mounted on the heat-generating device) and the server shell 560, which is in thermal contact with one or more evaporators 550. In the unengaged position, the liquid phase 507 circulates through the evaporator 550 but is not in thermal contact with the heat-generating devices 521, so no or negligible heat from the heat-generating device 521 is transferred to the liquid phase 507. In the engaged position, thermal contact between the heat-generating device 521 (or a thermal interface material mounted on the heat-generating device 521) and the evaporator 550 through the server shell 560 is created by the server board adjustment system. For example, the server board adjustment system may adjust (e.g., push) the server board 524 so that the heat-generating devices 521 come into thermal contact with an inner surface of the server shell 560. Heat from the devices 521 may thus be transferred through the server shell 560 to the evaporator 550.

The illustrated implementation of the thermosiphon cooling system 500 includes multiple evaporators 550 that are fluidly coupled to the condenser 515. In some aspects, each evaporator 550 may be a fluid channel formed between adjacent server shells 560, e.g., without a separate conduit to enclose the liquid phase 507 of the working fluid in the channels. In some aspects, each evaporator 550 may include a liquid conduit that encloses the liquid phase 507 of the working fluid between adjacent server shells 560.

In this example implementation of system 500, natural circulation is employed to move the liquid phase 507 of the working fluid from the condenser 515 to the evaporators 550, and to move the vapor phase 503 of the working fluid from the evaporators 550 to the condenser 515. Thus, the illustrated implementation of system 500 includes no pumps to circulate the working fluid and, further, includes no compressors to implement a mechanical refrigeration vapor compression cycle to cool the working fluid. In alternative implementations, a pump may be positioned in the server rack 505 to circulate liquid phase 507 of the working fluid from the condenser 515 to a bottom portion of the rack 505 to enter the evaporators 550.

In this illustrated example, the condenser 515 is positioned internal to the server rack 505 at or near a top portion of the rack 505. In this example implementation, the condenser 515 is a liquid-cooled condenser 515, which includes a condenser coil 539 over which the working fluid is circulated and one or more heat transfer surfaces 541 (e.g., fins) thermally coupled to the coil 539. The coil 539 receives the vapor (or mixed) phase 503 of the working fluid from the evaporators 550 (e.g., from top outlets 551 of the evaporators 550) and supplies the liquid phase 507 of the working fluid back to bottom inlets 553 of the evaporators 550.

In this example, a cooling liquid supply 525 (e.g., chilled or cooled water or glycol) may be circulated through the condenser coil 539. A cooling liquid return 530, including heat from the heat-generating devices 521, may be circulated from the coil 539 to a cooling liquid source (e.g., chiller, cooling tower, direct expansion condensing unit, heat exchanger, or other cooling liquid source).

Although a single condenser coil 539 is illustrated in this example, there may be multiple condenser coils 539. In some aspects, however, there may be a ratio of condenser coils 539 to evaporators 550 that is less than one. In other words, there may be more evaporators 550 than condenser coils 539, with each condenser coil 539 positioned to receive the vapor (or mixed) phase 503 of the working fluid from multiple evaporators 550. For instance, in an example implementation, there may be two condenser coils 539 to serve the evaporators 550 for the server rack 505. Thus, each condenser coil 539 would receive the vapor (or mixed) phase 503 from half (exactly or approximately) of the evaporators 550 and return the liquid phase 503 to the half of the evaporators 550. In some aspects, return of the liquid phase 503 to the bottom inlets 553 may occur by gravity feed from the condenser coils 539 to the bottom portion of the server rack 505. Further, each condenser coil 539 may have a respective cooling liquid supply 525 and cooling liquid return 530 through connections 535.

This may allow, in some instances, for redundant cooling of the heat-generating devices 521. For example, in some aspects, there may be multiple evaporators 550 per server rack sub-assembly 510 (e.g., multiple liquid conduits within each evaporator 550). Each evaporator 550 positioned for the server rack sub-assembly 510 may be in thermal contact (e.g., through a thermal interface or thermal interface material) with a particular heat-generating device 521 (e.g., processor or otherwise) or multiple heat-generating devices 521. Thus, different heat-generating devices 521 may be in thermal contact with different ones of the multiple evaporators 550 for the particular server rack sub-assembly 510. Also, each heat-generating device 521 on a server rack sub-assembly 510 may be in thermal contact with multiple evaporators 550 (e.g., multiple liquid conduits within each evaporator 550). A failure in one particular evaporator 550 of a server rack sub-assembly 510 may not, therefore, remove cooling for the entire server rack sub-assembly 510 or even a single heat-generating device 521. Further, in aspects in which evaporators 550 of a single server rack sub-assembly 510 are fluidly coupled to different condenser coils 539 of a system 500 that includes multiple condenser coils 539, a failure of a single condenser coil 539 may not remove cooling for the entire server rack sub-assembly 510 or even a single heat-generating device 521.

In an example operation, each evaporator 550 is placed into thermal contact one or more electronic devices 521, for example, by adjusting each server board 524 to thermally contact the particular server shell 560 that encloses the board 524. Heat is drawn by conductive heat transfer from the electronic device 521 to the evaporator 550. For example, the evaporator 550 is in conductive thermal contact with the electronic device 521 through the server shell 560 (or in thermal contact with the device 521 through a thermal interface material on the device 521 or on the shell 560). In operation, heat from the electronic device 521 causes the liquid phase 507 of the working fluid in the evaporator 550 to evaporate or change phase from liquid to a mixed phase (e.g., mixed liquid and vapor) or a vapor. The vapor (or mixed) phase 503 then circulates (e.g., naturally by density differences) upward through the top outlets 551 to the condenser 515. Heat is transferred away from the condenser 515 into the cooling liquid supply 525. For example, the cooling liquid supply 525 may be pumped through the condenser coil 539 in order to remove heat from the vapor phase 503 to the cooling liquid supply 525. Heat is transferred from the vapor phase 503 as it flows around in thermal contact with the condenser coil 539 and the fins 541. The cooling liquid return 530 circulates from the coil 539 carrying the heat transferred from the electronic devices 521. As heat is transferred away from the vapor (or mixed) phase 503 in the condenser 515, a phase change occurs to change the vapor phase 503 back to the liquid phase 507. The liquid phase 507 is circulated (e.g., naturally or otherwise) to a bottom portion of the server rack 505 to be provided to the evaporators 550 to repeat the process.

A number of embodiments have been described. Nevertheless, it will be understood that various modifications may be made without departing from the spirit and scope of what is described. For example, the steps of the exemplary operations described herein may be performed in other orders, some steps may be removed, and other steps may be added. Accordingly, other embodiments are within the scope of the following claims.

What is claimed is:

1. A data center server rack system, comprising:
   a server rack that supports a plurality of data center electronic devices mounted on a plurality of server board assemblies within a volume of a housing of the server rack;
   a plurality of evaporator modules positioned in the housing and in thermal communication with the plurality of data center electronic devices;
   a condenser that comprises a heat exchanger in fluid communication with the plurality of evaporator modules and mounted to the housing;
   a fluid coolant that circulates through the plurality of evaporator modules to receive heat from the plurality of data center electronic devices such that at least a portion of the fluid coolant changes to a vapor phase that is circulated to the heat exchanger of the condenser to change into a liquid phase of the fluid coolant; and
   a plurality of shells, each shell comprising a volume that encloses a particular server board assembly of the plurality of server board assemblies and is fluidly isolated from the fluid coolant that circulates through at least one of the plurality of evaporator modules by the shell, the shell further comprising an exterior surface that is in fluid contact with the fluid coolant.

2. The system of claim 1, wherein each of the evaporator modules comprises a flow path through the volume adjacent at least one of the server board assemblies, each flow path in fluid communication with the other flow paths within the volume.

3. The system of claim 1, wherein the fluid coolant naturally circulates through the plurality of evaporator modules to receive heat from the plurality of data center electronic devices such that the portion of the fluid coolant changes to the vapor phase that is naturally circulated to the heat exchanger of the condenser to change into the liquid phase of the fluid coolant.

4. The system of claim 1, wherein the volume comprises a vapor phase volume portion and a liquid phase volume portion.

5. The system of claim 1, further comprising a thermal interface material mounted on at least one of the data center electronic devices mounted on the particular server board assembly.

6. The system of claim 1, wherein the particular server board assembly comprises a spring-loaded cam or piston positioned to urge the particular server board assembly toward an interior surface of the shell to urge the data center electronic devices mounted on the particular server board assembly into direct conductive thermal contact with the fluid coolant through the interior surface of the shell.

7. The system of claim 6, wherein the shell is in at least one of conductive or convective thermal contact with a particular one of the plurality of evaporator modules.

8. The system of claim 1, wherein the condenser comprises a single condenser.

9. The system of claim 8, wherein the single condenser comprises a liquid cooled condenser having at least one condenser liquid inlet and at least one condenser liquid outlet.

10. The system of claim 8, wherein the single condenser is mounted within the housing of the server rack.

11. A method for cooling a plurality of data center electronic devices, comprising:
   circulating a liquid phase of a fluid coolant through a plurality of evaporator modules that are positioned in a volume of a housing of a server rack that supports the plurality of data center electronic devices mounted on a plurality of server board assemblies within the volume of the housing, a particular server board assembly enclosed in a volume of a shell that comprises an exterior surface in fluid contact with the fluid coolant;
   fluidly isolating the data center electronic devices mounted on the particular server board from the fluid coolant by the shell;
   transferring heat from the plurality of data center electronic devices, through the shell, to the liquid phase of the fluid coolant circulating within the plurality of evaporator modules;
   vaporizing, with the transferred heat, at least a portion of the liquid phase of the fluid coolant to a vapor phase of the fluid coolant;
   circulating the vapor phase of the fluid coolant from the plurality of evaporator modules to a condenser that comprises a heat exchanger mounted to the housing; and
   condensing, with the heat exchanger, the vapor phase of the fluid coolant to a liquid phase of the fluid coolant.

12. The method of claim 11, wherein each of the evaporator modules comprises a flow path through the volume adjacent at least one of the server board assemblies, each flow path in fluid communication with the other flow paths within the volume.

13. The method of claim 11, wherein circulating the liquid phase of the fluid coolant comprises naturally circulating the liquid phase of the fluid coolant, and circulating the vapor phase of the fluid coolant comprises naturally circulating the vapor phase of the fluid coolant.

14. The method of claim 13, wherein naturally circulating the liquid phase of the fluid coolant comprises naturally circulating the liquid phase from a vapor phase volume portion of the volume to a liquid phase volume portion of the volume, and naturally circulating the vapor phase of the fluid coolant comprises naturally circulating the vapor phase from the liquid phase volume portion of the volume to the vapor phase volume portion of the volume.

15. The method of claim 11, wherein the condenser comprises a single condenser.

16. The method of claim 15, further comprising removing heat from the single condenser with a flow of a condenser liquid.

17. The method of claim 15, wherein the single condenser is mounted within the housing of the server rack.

18. The method of claim 11, further comprising urging the particular server board assembly toward an interior surface of the shell to move the data center electronic devices mounted on the particular server board assembly into direct conductive thermal contact with the liquid phase of the fluid coolant through the interior surface of the shell.

19. The method of claim 18, further comprising:
   conductively transferring heat from the data center electronic devices mounted on the particular server board assembly to the shell; and
   at least one of conductively or convectively transferring the heat from the shell into the fluid coolant circulating in at least one of the plurality of evaporator modules.

20. The method of claim 19, further comprising conductively transferring heat through a thermal interface material mounted on at least one of the center electronic devices mounted on the particular server board assembly to the shell.

* * * * *